(12) United States Patent
Hayakawa

(10) Patent No.: US 7,723,717 B2
(45) Date of Patent: May 25, 2010

(54) SEMICONDUCTOR MEMORY DEVICE AND FABRICATION METHOD THEREOF

(75) Inventor: Tsutomu Hayakawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 154 days.

(21) Appl. No.: 11/826,870

(22) Filed: Jul. 19, 2007

(65) Prior Publication Data

US 2008/0048170 A1 Feb. 28, 2008

(30) Foreign Application Priority Data

Aug. 22, 2006 (JP) ............................ 2006-225768

(51) Int. Cl.
*H01L 29/00* (2006.01)
*H01L 47/00* (2006.01)
*H01L 29/04* (2006.01)

(52) U.S. Cl. ............ 257/4; 257/3; 257/5; 257/E45.002; 438/102; 438/900; 365/148; 365/163

(58) Field of Classification Search ........................ None
See application file for complete search history.

(56) References Cited

U.S. PATENT DOCUMENTS

| 6,586,761 | B2 | 7/2003 | Lowrey |
| 6,815,705 | B2 | 11/2004 | Klersy et al. |
| 6,909,107 | B2 * | 6/2005 | Rodgers et al. ............. 257/3 |
| 7,151,300 | B2 | 12/2006 | Chang |
| 7,307,269 | B2 | 12/2007 | Kim et al. |
| 7,329,579 | B2 * | 2/2008 | Ha et al. ..................... 438/257 |
| 7,521,706 | B2 * | 4/2009 | Jeong et al. ................... 257/3 |
| 7,532,507 | B2 * | 5/2009 | Hayakawa ................. 365/163 |
| 2003/0047762 | A1 | 3/2003 | Lowrey |
| 2005/0185444 | A1 | 8/2005 | Yang et al. |
| 2006/0043355 | A1 * | 3/2006 | Ryoo et al. ................... 257/2 |
| 2006/0113521 | A1 | 6/2006 | Lung |
| 2006/0273297 | A1 * | 12/2006 | Happ ............................ 257/4 |
| 2007/0117315 | A1 * | 5/2007 | Lai et al. .................... 438/257 |
| 2008/0006813 | A1 * | 1/2008 | Hayakawa .................... 257/4 |
| 2008/0042118 | A1 * | 2/2008 | Hayakawa .................... 257/4 |

FOREIGN PATENT DOCUMENTS

| CN | 1554125 | 12/2004 |
| CN | 1616572 | 5/2005 |
| JP | 2006-019687 | 1/2006 |
| JP | 2006-173635 | 6/2006 |

OTHER PUBLICATIONS

Chinese Patent Office issued a Chinese Office Action dated Dec. 25, 2009, Application No. 2007101424171.

* cited by examiner

*Primary Examiner*—Andy Huynh
*Assistant Examiner*—Hoang-Quan T Ho
(74) *Attorney, Agent, or Firm*—Young & Thompson

(57) ABSTRACT

A semiconductor memory device comprises a heater electrode, a phase change portion, and an upper electrode. The phase change portion is connected to the heater electrode in a first direction. The upper electrode has an upper surface, a lower surface and a hole. The hole pierces the upper electrode between the upper and the lower surfaces in the first direction. The hole has an inner wall, which is connected to the phase change portion in a second direction perpendicular to the first direction.

14 Claims, 16 Drawing Sheets

SEMICONDUCTOR MEMORY DEVICE AND FABRICATION METHOD THEREOF

BACKGROUND OF THE INVENTION

This invention relates to a semiconductor memory device and, in particular, to a phase change memory device and to a forming method thereof.

A phase change memory device is disclosed in, for example, US 2005/0185444 A1 or U.S. Pat. No. 6,815,705 B2, these documents being incorporated herein by reference in their entireties.

There is a need for a phase change memory device that can effectively supply heat with its phase change portion and can be fabricated easily.

SUMMARY OF THE INVENTION

According to one aspect of the present invention, a semiconductor memory device such as a phase change memory device comprises a heater electrode, a phase change portion, and an upper electrode. The phase change portion is connected to the heater electrode in a first direction. The upper electrode has an upper surface, a lower surface and a hole. The hole pierces the upper electrode between the upper and the lower surfaces in the first direction. The hole has an inner wall, which is connected to the phase change portion in a second direction perpendicular to the first direction.

An appreciation of the objectives of the present invention and a more complete understanding of its structure may be had by studying the following description of the preferred embodiment and by referring to the accompanying drawings.

Figure 1:
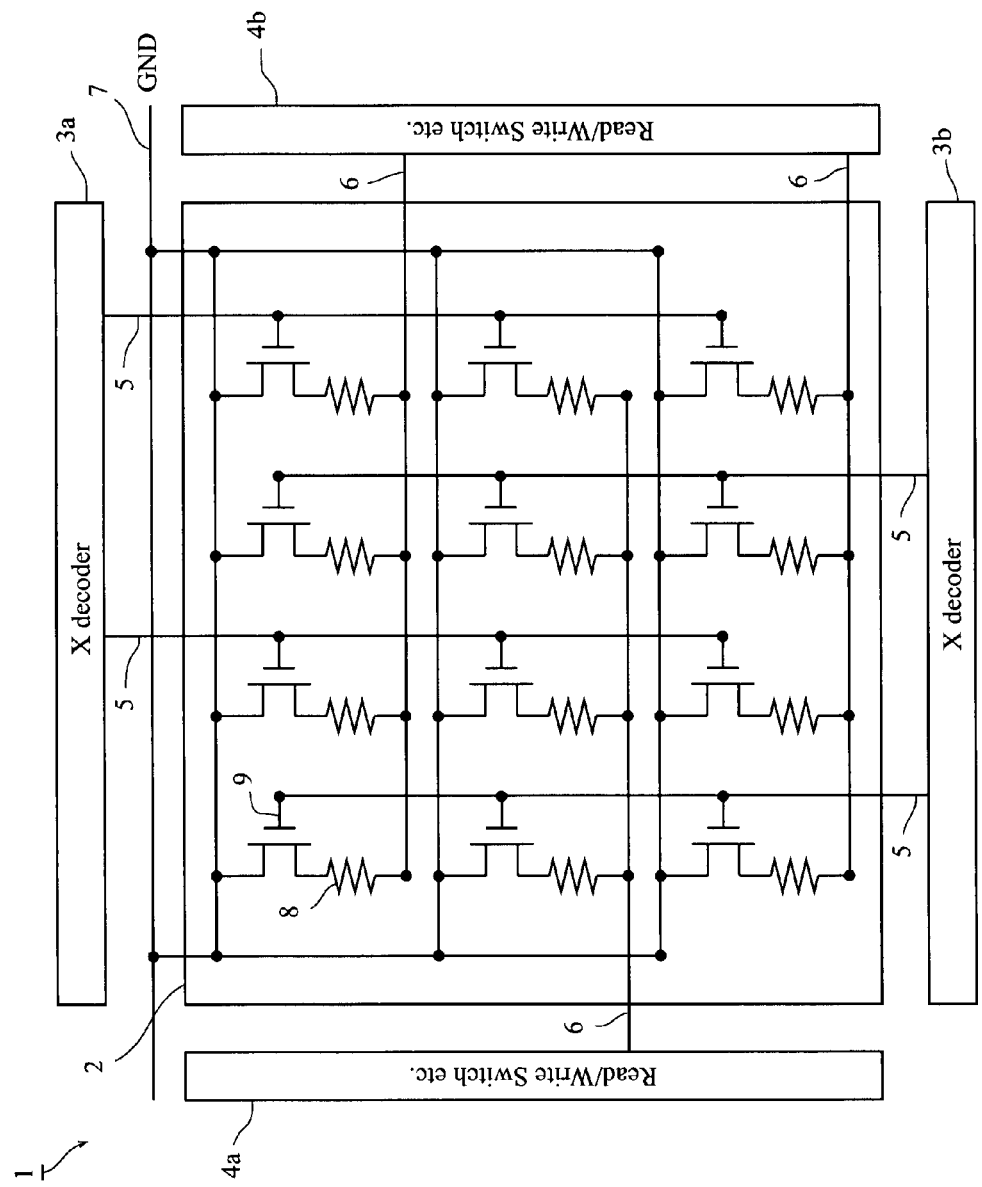
FIG. 1 is a view schematically showing in part a phase change memory device in accordance with an embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

With reference to FIG. 1, a phase change memory device 1 according to a first embodiment of the present invention comprises a memory cell array 2, X decoders 3a, 3b, read/write switch blocks 4a, 4b, gate lines 5, bit lines 6, ground lines 7 and various circuit around them (not shown).

The memory cell array 2 is arranged between the X decoders 3a, 3b and also between the read/write switch blocks 4a, 4b. Each of the gate lines 5 extends from the X decoder 3a or 3b over the memory cell array 2. Each of the bit lines 6 extends from the read/write switch block 4a or 4b over the memory cell array 2 so that the bit lines 6 intersect the gate lines 5 as see from the above. The ground lines 7 are to be supplied with a ground level voltage and is formed throughout the memory cell array 2.

The memory cell array 2 is constituted by a plurality of memory cells, which are arranged in a matrix form. Each of the memory cells is comprised of a resistor 8 and a transistor 9. The gate electrode of the transistor 9 is coupled to one of the gate lines 5. The drain electrode of the transistor 9 is coupled to one end of the corresponding resistor 8. The source electrode of the transistor 9 is coupled to the ground line 7. The other end of the corresponding resistor 8 is coupled to one of the bit lines 6.

The resistor 8 is made of a phase change material. One of phase change materials is a chalcogenide material including at least one chalcogen element such as sulfur (S), selenium (Se), and tellurium (Te); one of typical chalcogenide materials is $Ge_xSb_yTe_z$ (GST). Another material of $As_xSb_yTe_z$, $Ta_xSb_yTe_z$, $Nb_xSb_yTe_z$, $V_xSb_yTe_z$, $Ta_xSb_yTe_z$, $Nb_xSb_ySe_z$, $V_xSb_ySe_z$, $W_xSb_yTe_z$, $Mo_xSb_yTe_z$, $Cr_xSb_yTe_z$, $W_xSb_ySe_z$, $Mo_xSb_ySe_z$, $Cr_xSb_ySe_z$, or $Sn_xSb_yTe_z$ may be used. The phase change material such as chalcogenide material can have two different states, an amorphous state and a crystalline state, in response to temperature applied thereto. The amorphous state and the crystalline state have different resistances from each other. The different resistances are utilized for storing data "0" and "1" in each memory cell, respectively.

Figure 2:
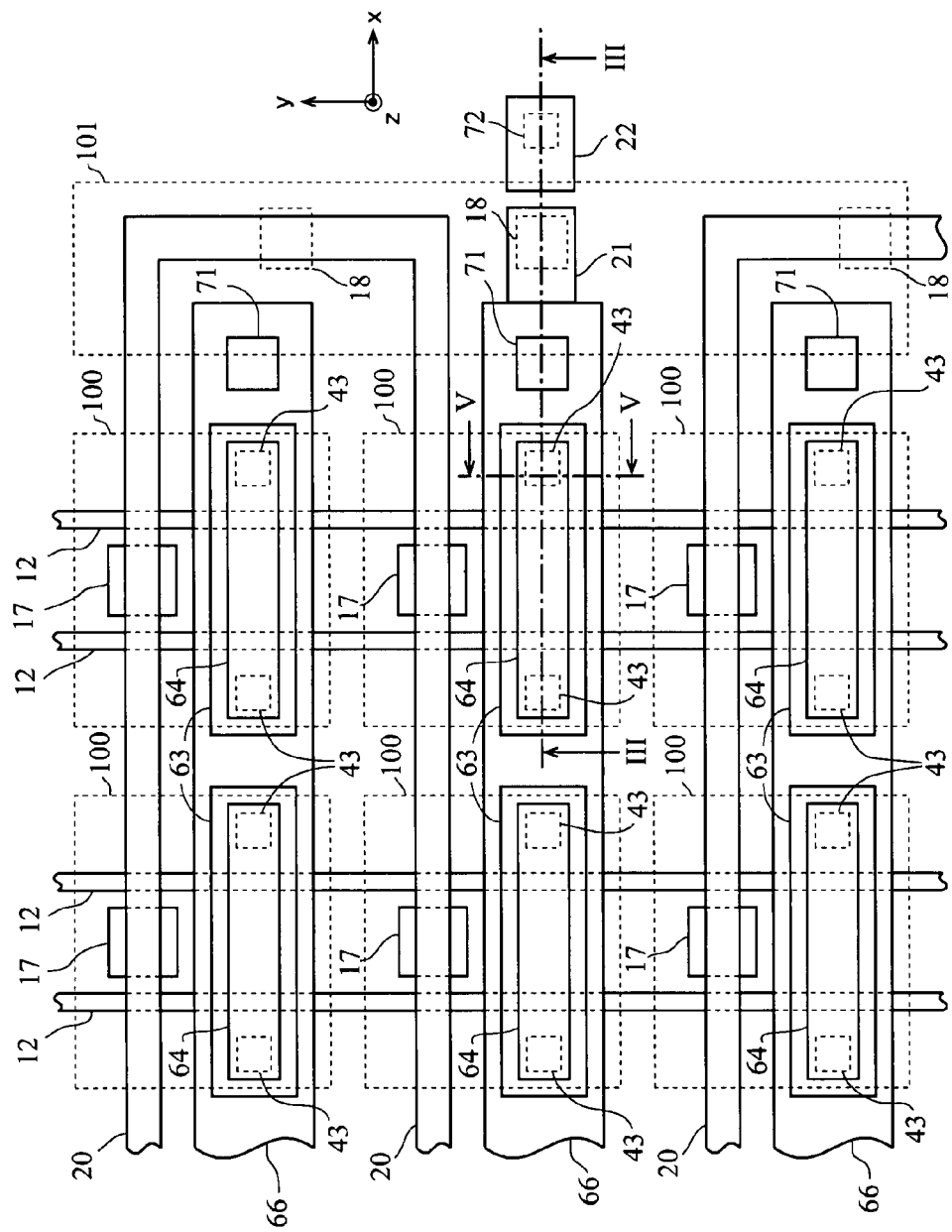
FIG. 2 is a view schematically showing in part a layout of the phase change memory device of FIG. 1.
Figure 3:
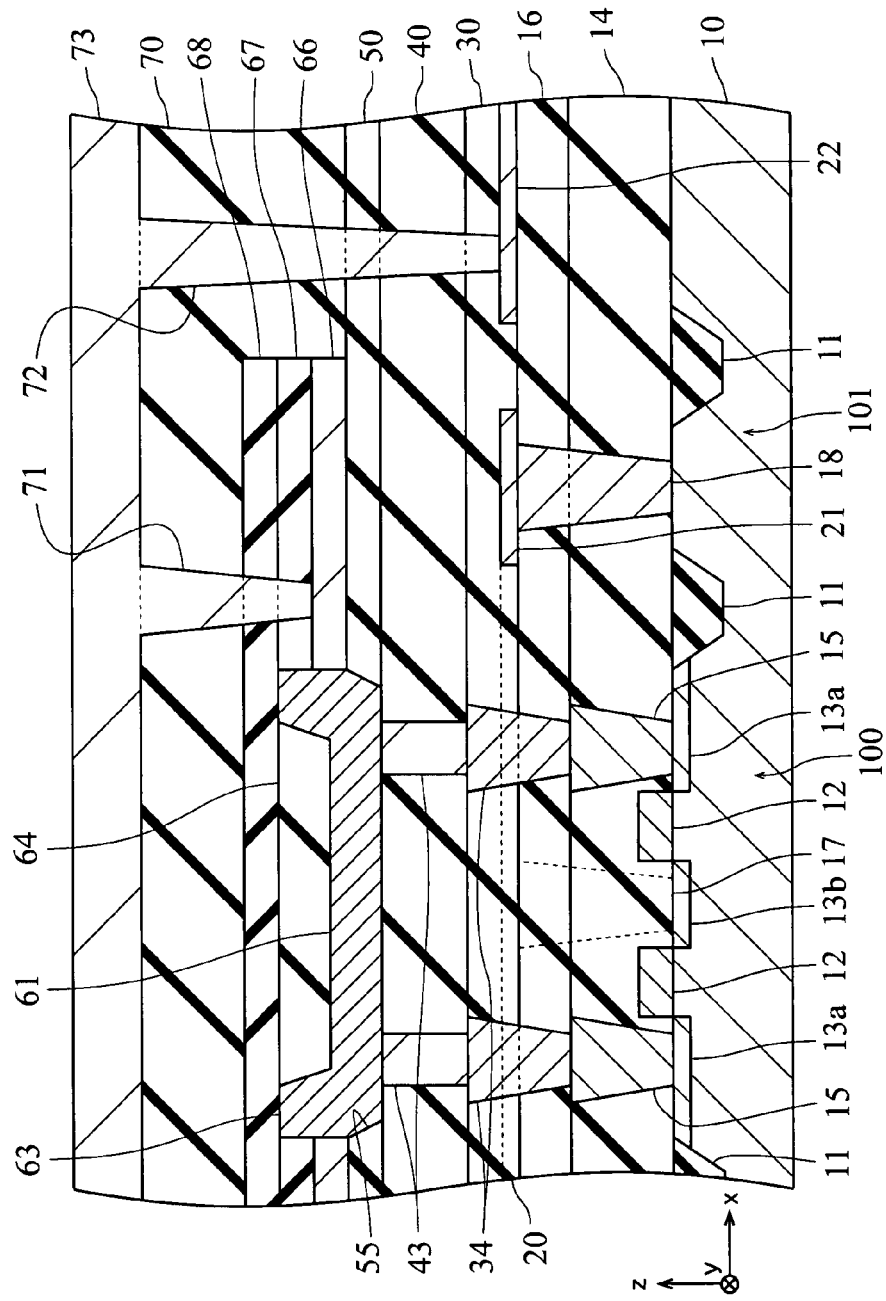
FIG. 3 is a cross-sectional view showing the phase change memory taken along with lines III-III of FIG. 2.

With reference to FIG. 3, the phase change memory device 1 of this embodiment comprises a semiconductor substrate 10. In the semiconductor substrate 10, a plurality of field regions 100 are divided and are electrically isolated by a shallow trench isolation (STI) region 11, as apparent from FIGS. 2 and 3. The STI region 11 also electrically isolates the field regions 100 from a peripheral region 101 which is formed with contact plugs 18 for peripheral circuits or the like. As shown in FIG. 2, the field regions 100 are regularly arranged in matrix form. In each of the field regions 100, two transistors are formed, as apparent from FIGS. 2 and 3. Each of the transistors has a gate electrode 12, a drain region 13a and a source region 13b.

On the semiconductor substrate 10, an insulator layer 14 is formed. In the insulator layer 14, cell contact plugs 15 are formed to be coupled on the drain regions 13a of the transistors, respectively. On the insulator layer 14, another insulator layer 16 is formed. On the insulator layer 16, ground lines 20 and other conductive lines 21, 22 are formed. The ground lines 20 are coupled to the source regions 13b by means of ground contact plugs 17 each of which pierces through the insulator layers 14, 16. Likewise, the conductive lines 21 are coupled to particular regions of the semiconductor substrate 10 by means of the contact plugs 18 piercing through the insulator layers 14, 16. On the insulator layer 16 as well as the ground lines 20 and the conductive lines 21, 22, yet another insulator layer 30 is formed. Middle contact plugs 34 are formed to pierce the insulator layers 30, 16. The middle contact plugs 34 are connected to the cell contact plugs 15.

On the insulator layer 30, still another insulator layer 40 is formed. In the insulator layer 40, heater pillars 43 serving as heater electrodes are formed. The illustrated heater pillars 43 are made of titanium nitride (TiN). In this embodiment, two of the heater pillars 43 are formed for each field region 100, as shown in FIG. 2.

Figure 4:
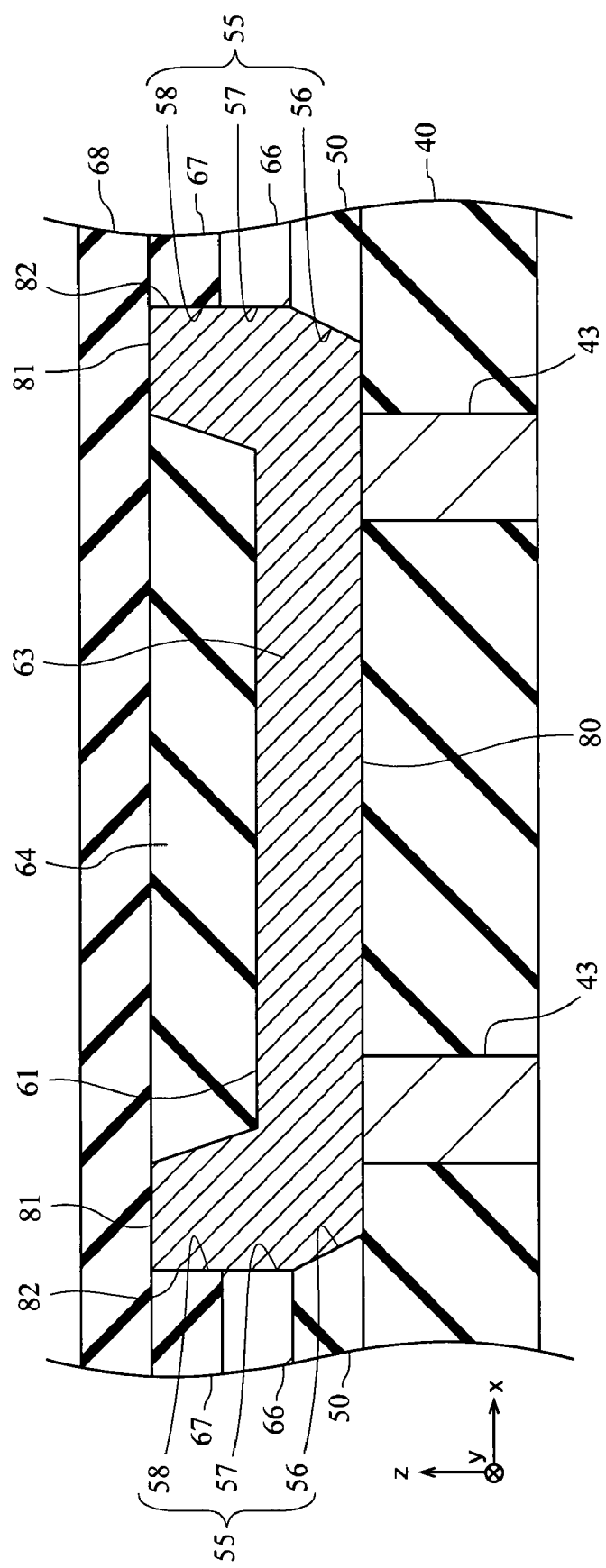
FIG. 4 is an enlarged, cross-sectional view showing in part the phase change memory of FIG. 3.
Figure 5:
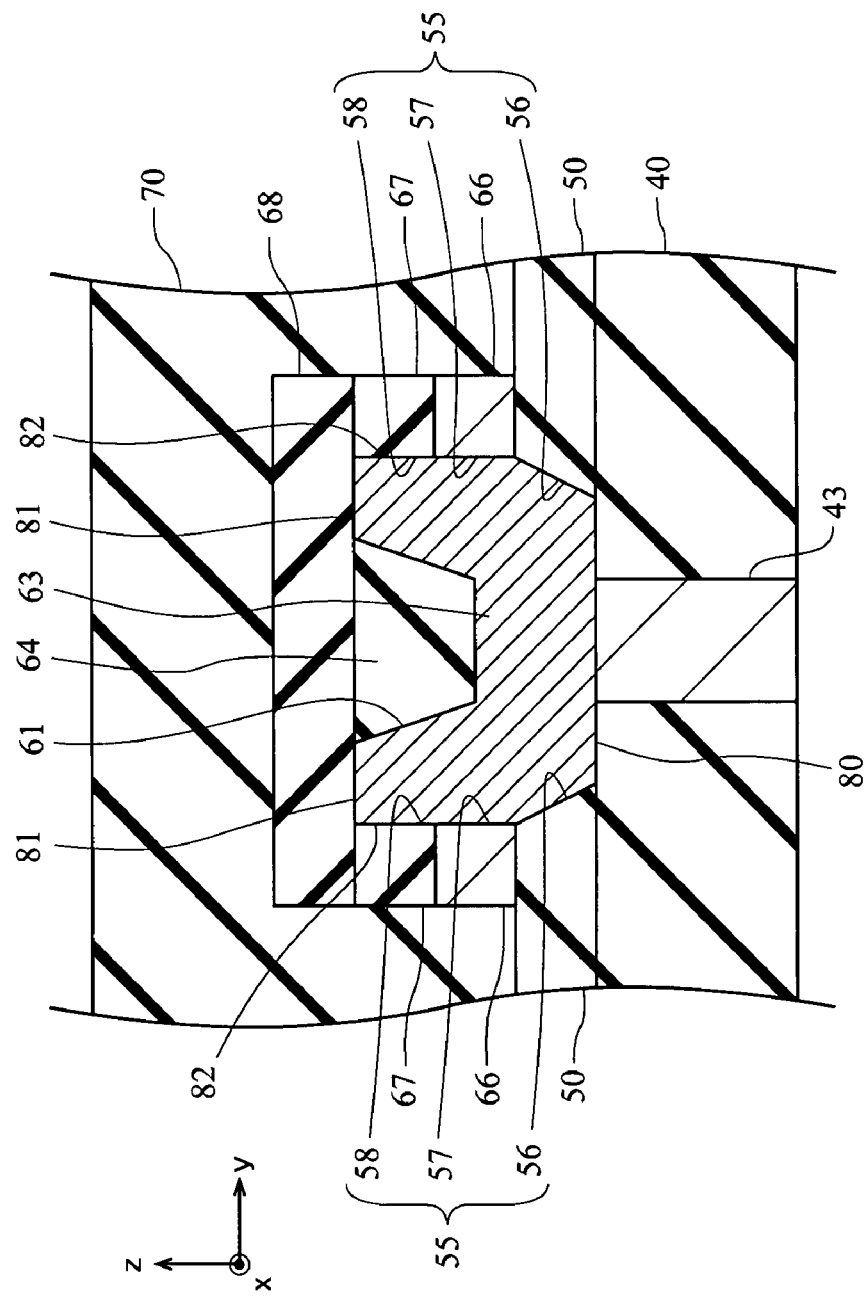
FIG. 5 is a cross-sectional view showing the phase change memory taken along with lines V-V of FIG. 2.

On the insulator layer 40, another insulator layer 50 is formed. On a part of the insulator layer 50, an upper electrode 66 and a stopper layer 67 are further stacked. A plurality of holes 55 is formed to pierce the stopper layer 67, the upper electrode 66 and the insulator layer 50. In detail, the insulator layer 50 has inner walls 56, the upper electrode 66 has inner walls 57, and the stopper 67 has inner walls 58; each set of an inner wall 56, an inner wall 57 and an inner wall 58 constitute one of the piercing holes 55, as shown in FIGS. 4 and 5. As understood from FIGS. 2 to 5, the holes 55 correspond in number to the field regions 100 in this embodiment. Each of the holes 55 has a substantially-rectangular shape as seen from the above. In this embodiment, each hole 55 has a longitudinal direction along an x-direction. The holes 55 are arranged in the x-direction on the upper electrode 66 so that the upper electrode 66 of the present embodiment has a ladder-shape. As understood from FIGS. 2 to 5, two of the heater pillars 43 are exposed in one of the holes 55. In other words, each of the holes 55 covers corresponding two heater pillars 43, while the heater pillars 43 do not overlap with the upper electrode 66, as seen along a z-direction. In this embodiment, two heater pillars 43 are arranged in a hole 55 along the x-direction.

Within each of the holes 55, a corresponding phase change portion 63 is formed, as shown in FIGS. 2 to 5. In this embodiment, each phase change portion 63 is connected to two heater pillars 43 in the z-direction. As shown in FIGS. 3 to 5, each of the phase change portion 63 is connected to the inner wall 57 of the upper electrode 66 in the x-direction and a y-direction. In this embodiment, the illustrated upper electrode 66 completely surrounds and is connected to each phase change portion 63 in the xy plane. As apparent from FIG. 3, each phase change portion 63 of the present embodiment pierces the corresponding upper electrode 66. In other words, each phase change portion 63 extends across the lower and the upper surfaces of the corresponding upper electrode 66.

In detail, the phase change portion 63 has a bottom surface 80, a top surface 81 and side surfaces 82. The bottom surface 80 is connected to the heater pillars 43. The total area size of the connection between the bottom surface 80 and the corresponding bottom surface 80 is sufficiently smaller than the area size of the bottom surface 80. The top surface 81 of this embodiment has a closed loop-like shape and has inner and outer edges. The top surface 81 of the present embodiment is laid on a same level as an upper surface of the stopper layer 67. The side surfaces 82 connect between the bottom and the top surfaces 80, 81 and are connected to the upper electrode 66. In this embodiment, the upper electrode 66 is connected to each phase change portion 63 only on its side surface 82.

Figure 6:
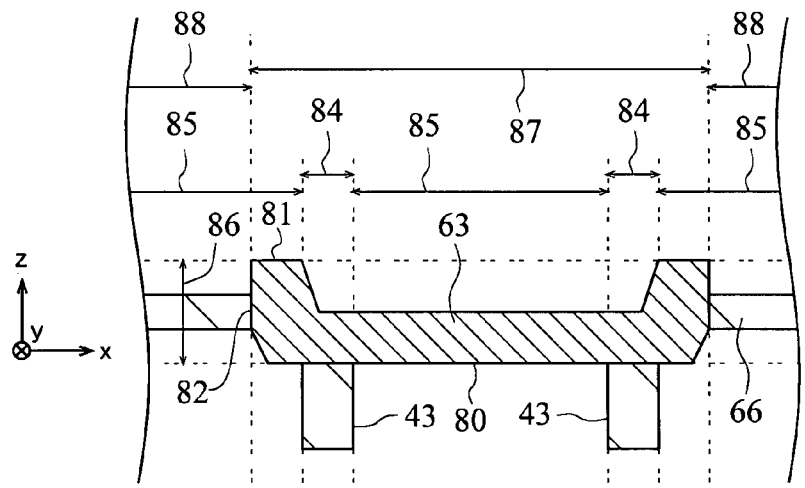
FIG. 6 is a cross-sectional view showing a relation among heater pillars, a phase change portion and an upper electrode, which are included in the phase change memory of FIG. 3.

With reference to FIG. 6, explanation is here made of arrangement and connection among the heater pillars 43, the phase change portion 63 and the upper electrode 66. In FIG. 6, two projection regions 84 correspond to the respective heater pillars 43. The upper electrode 66 has a projection region 88 which belongs to a projection region 85 other than the projection regions 84. Therefore, as mentioned above, the upper electrode 66 does not overlap with the heater pillars 43 as seen along the z-direction. In detail, the phase change portion 63 has a projection region 87, and the projection region 88 of the upper electrode 66 belongs to a region out of the projection regions 87. The phase change portion 63 has a predetermined height 86, which is larger than a thickness of the upper electrode 66. In addition, the upper electrode 66 is positioned between the bottom surface 80 and the top surface 81 in the z-direction, as apparent from FIGS. 3 to 6. Therefore, the upper electrode 66 of the present embodiment is connected to the phase change portion 63 only on the side surface 82 of the phase change portion 63, as mentioned above.

Figure 7:
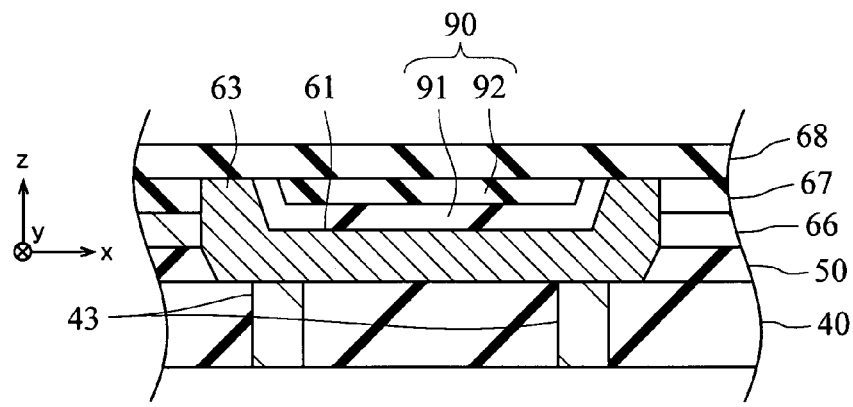
FIG. 7 is a cross-sectional view showing a modification of the phase change memory of FIG. 4.
Figure 8:
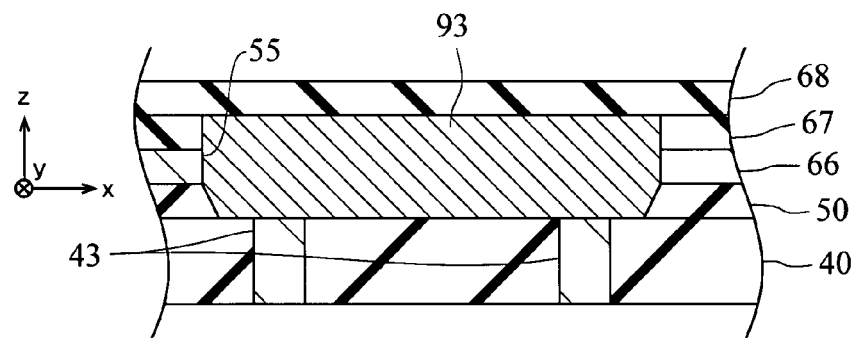
FIG. 8 is a cross-sectional view showing another modification of the phase change memory of FIG. 4.

As shown in FIGS. 3 to 5, the phase change portion 63 of the present embodiment is formed with a concave portion 61 which is depressed downwardly from the inner edge of the top surface 81. Within the concave portion 61, a heat insulation portion 64 is formed. The heat insulation portion 64 of the present embodiment has a surface which is laid on a same level as the upper surface of the stopper layer 76 and the top surface 81 of the phase change portion 63. Each heat insulation portion 63 is made of a material having high heat resistance. Specifically, the illustrated heat insulation portions 63 are made of electrical-insulation material, especially, silicon oxide ($SiO_2$). Another electrical-insulation material such as silicon nitride (SiN) may be used. In addition, each heat insulation portion 63 may be comprised of two or more heat insulation layers stacked. In FIG. 7, a modification of a heat insulation portion 90 is shown, comprising two heat insulation layers 91, 92 stacked. In the modification, the heat insulation layer 91 is made of $SiO_2$, and the heat insulation layer 92 is made of SiN. Alternatively, as shown in FIG. 8, the phase change portion 93 may be formed without a concave portion. In the illustrated modification of FIG. 8, the hole 55 is completely filled with the phase change portion 93.

With reference to FIGS. 3 to 5, a cover layer 68 is formed on the stopper layer 67, the top surface of the phase change portion 63 and the heat insulation portions 64. In this embodiment, the cover layer 68 overlaps with the phase change portions 63 and the heat insulation portions 64. Each of the illustrated heat insulation portions 64 is hermetically and completely enclosed or packed only by the phase change portion 63 and the cover layer 68.

With reference to FIG. 3, another insulator layer 70 is formed on the cover layer 68 and the insulator 50. On the insulator layer 70, a conductive line layer 73 is formed. As apparent from FIGS. 2 and 3, the conductive line layer 73 is electrically connected to the upper electrodes 66 via contact plugs 71, which are formed in the insulator 70. Likewise, the conductive layer 73 is also electrically connected to the conductive lines 22 through contact plugs 72, each of which pierces through the insulator layers 30, 40, 50, 70.

Next explanation will be made about a fabrication method of the above-described phase change memory device 1, with reference to FIGS. 9 to 22.

Figure 9:
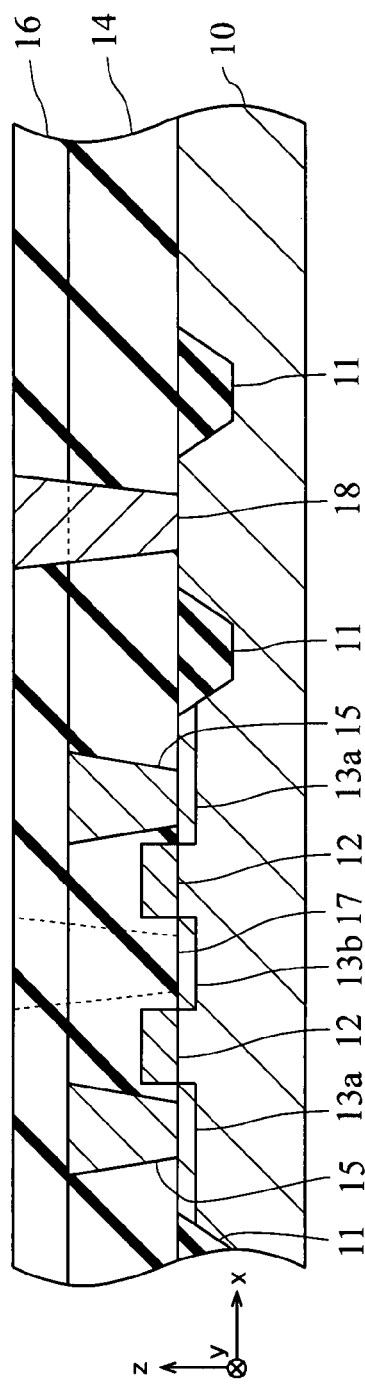
FIG. 9 is a cross-sectional view showing a fabrication process for the phase change memory device of FIG. 3.

As shown in FIG. 9, the STI region 11 is formed in the p-type semiconductor substrate 10 in a mesh form to define a plurality of field regions 100 (see FIG. 2). The illustrated STI region 11 has a thickness of 240 nm in a z-direction.

Next, a gate insulator film is formed on the semiconductor substrate 10 to have a thickness of 7 nm. On the gate insulator film, a doped poly-silicon layer and a tungsten silicide layer are deposited; the doped poly-silicon layer has a thickness of 100 nm; the tungsten silicide layer has a thickness of 100 nm. A mask is formed on the tungsten silicide layer through a photolithography technique. The doped poly-silicon layer and the tungsten silicide layer are exposed to an anisotropic etching to form the gate electrodes 12, as shown in FIG. 9. Each of the gate electrodes 12 extends in a y-direction. As shown in FIG. 2, two gate electrodes 12 extend over each field region 100.

Next, phosphorus (P) ions are implanted into the semiconductor substrate 10 by using the gate electrodes 12 as masks. Then, the semiconductor substrate 10 is exposed to a heat treatment process to form the drain regions 13a and the source regions 13b, wherein the drain regions 13a and the source regions 13b are of n-type.

Next, a tetra ethoxysilane (TEOS) material is deposited on the semiconductor substrate 10 to have a thickness of 700 nm. The TEOS material is exposed to a chemical mechanical polishing (CMP) process to be flattened. The flattened TEOS layer is the insulator layer 14. Contact holes are formed to pierce through the insulator layer 14 and to reach the drain regions 13a. Then, a doped poly-silicon layer of 250 nm is deposited on the insulator layer 14 including the contact holes and is subjected to a CMP process to be flattened. Thus, the cell contact plugs 15 are formed. In this embodiment, two cell contact plugs 15 are arranged in the x-direction within each field region 100.

On the insulator layer 14, a silicon oxide film of 200 nm is deposited as the insulator 16. Contact holes are formed to pierce through the insulator layers 14 and 16 and to reach the source regions 13b. On the insulator layer 16 including the contact holes, a titanium (Ti) layer of 10 nm, a titanium nitride (TiN) layer of 15 nm and a tungsten (W) layer of 250 nm are deposited in this order and are exposed to a CMP process to form the ground contact plugs 17. As apparent from FIGS. 2, 3 and 9, the ground contact plugs 17 and the cell contact plugs 15 are positioned away from each other in the y-direction. In this embodiment, the contact plugs 18 are also formed upon the formation of the ground contact plugs 17.

Figure 10:
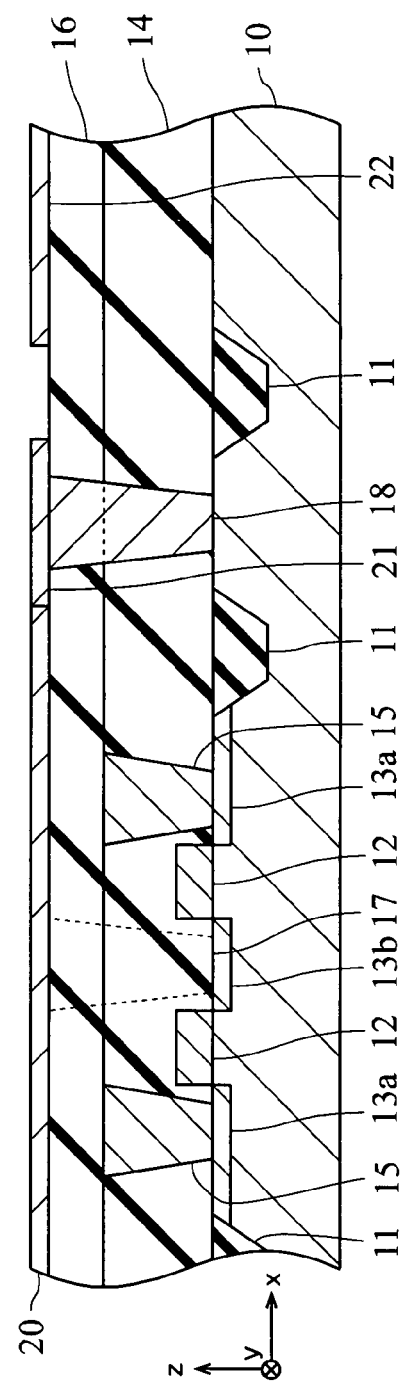
FIG. 10 is a cross-sectional view showing a subsequent fabrication process for the phase change memory device of FIG. 3.

Next, a tungsten nitride (WN) film of 5 nm is formed on the insulator layer 16, and, a tungsten (W) film of 50 nm is in turn formed on the WN film. The W film and the WN film are exposed to a patterning process to form the ground lines 20 electrically coupled to the ground contact plugs 17. In this embodiment, the conductive lines 21 and 22 are also formed upon the formation of the ground lines 20, as shown in FIG. 10.

Figure 11:
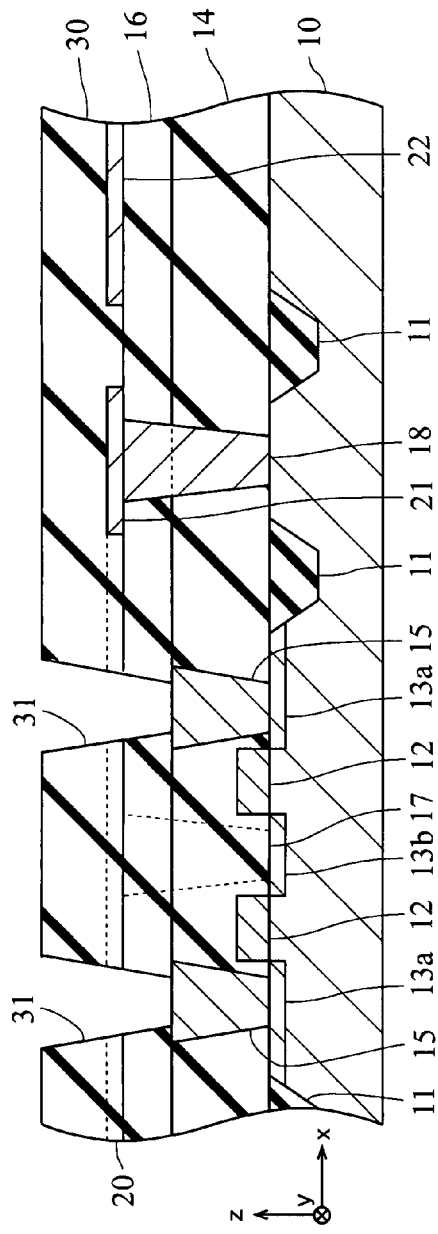
FIG. 11 is a cross-sectional view showing a subsequent fabrication process for the phase change memory device of FIG. 3.
Figure 12:
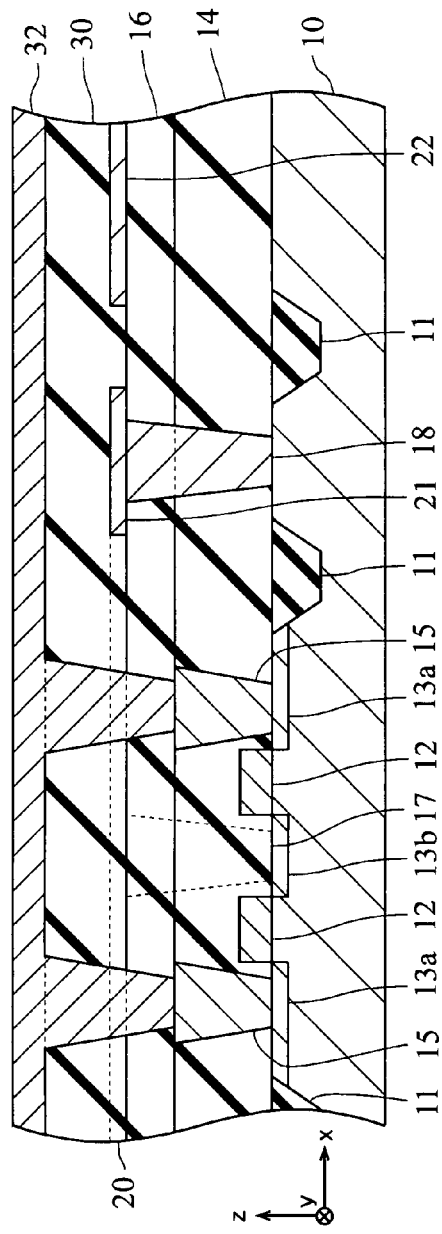
FIG. 12 is a cross-sectional view showing a subsequent fabrication process for the phase change memory device of FIG. 3.
Figure 13:
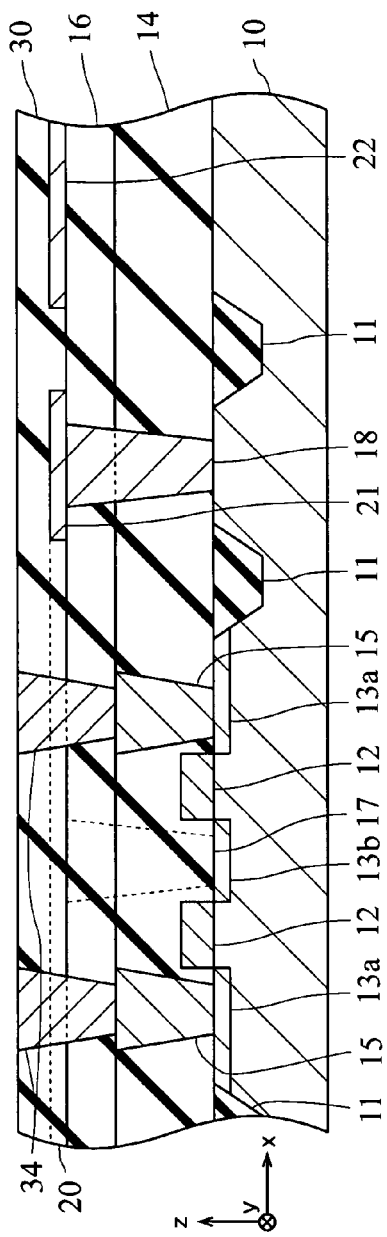
FIG. 13 is a cross-sectional view showing a subsequent fabrication process for the phase change memory device of FIG. 3.

Next, an oxide layer of 500 nm is formed on the insulator layer 16 as well as the lines 20 to 22 and is exposed to a CMP process to form the insulator layer 30. As shown in FIG. 11, contact holes 31 are formed to pierce through the insulator layer 16 and the insulator layer 30 so that the cell contact plugs 15 can be seen through the contact holes 31, respectively. Then, a titanium (Ti) material of 10 nm and a titanium nitride (TiN) material of 50 nm are deposited in this order to form a contact material layer 32, as shown in FIG. 12. The contact material layer 32 is exposed to a CMP process up to the surface of the insulator layer 30 to form the middle contact plugs 34, as shown in FIG. 13.

Figure 14:
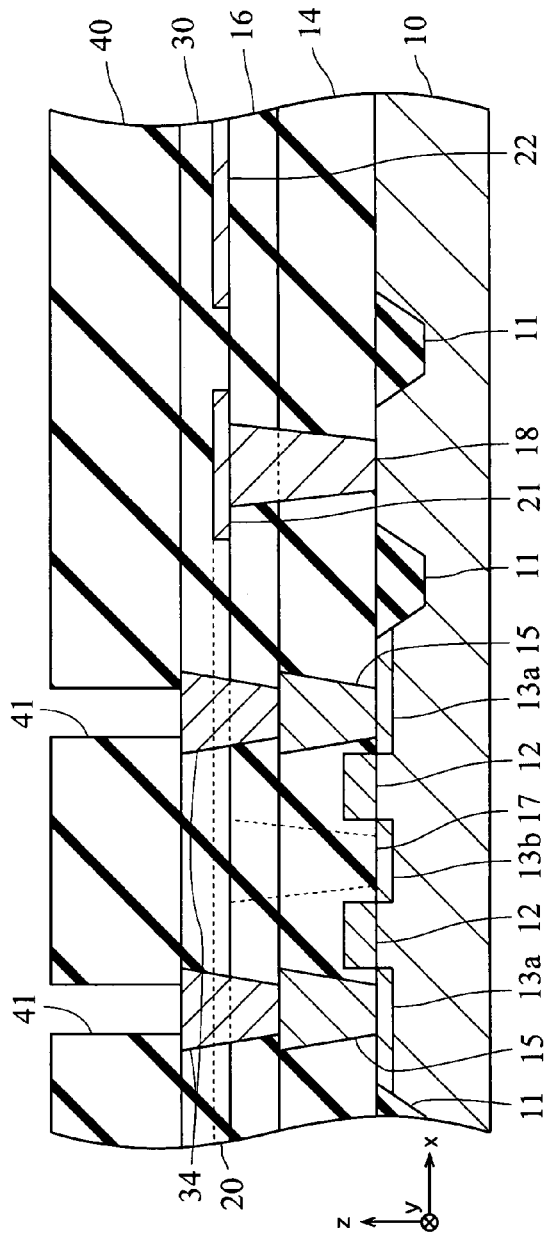
FIG. 14 is a cross-sectional view showing a subsequent fabrication process for the phase change memory device of FIG. 3.
Figure 15:
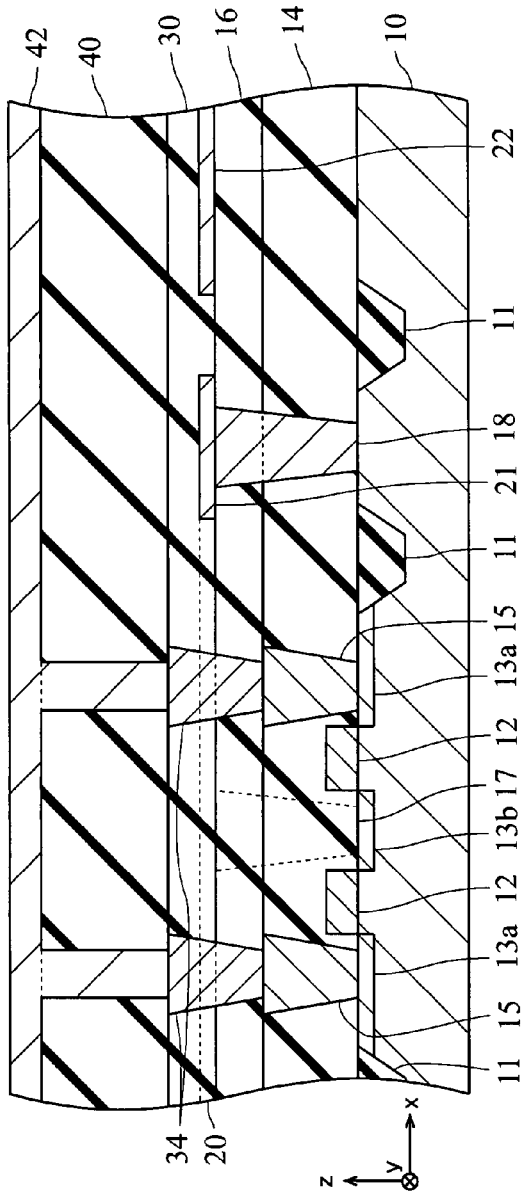
FIG. 15 is a cross-sectional view showing a subsequent fabrication process for the phase change memory device of FIG. 3.
Figure 16:
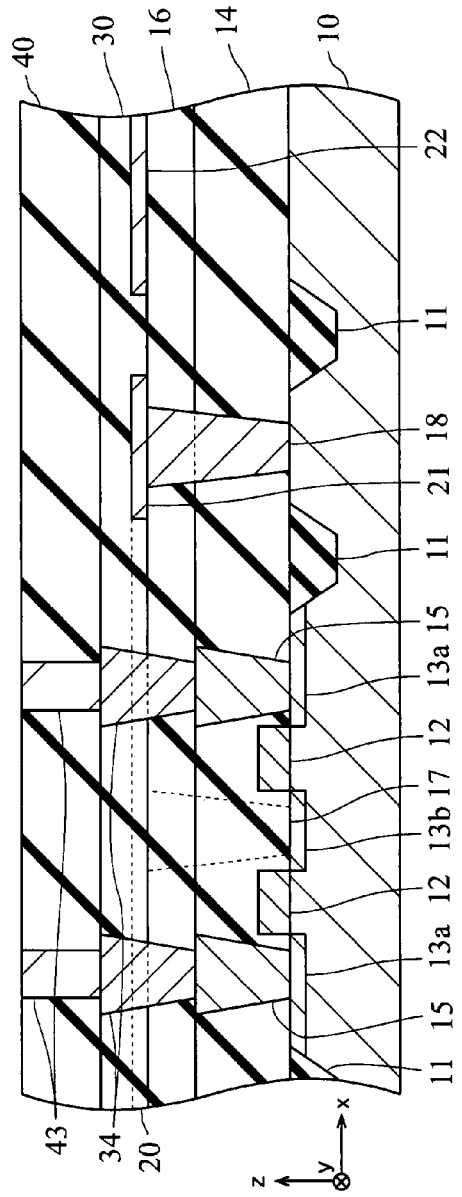
FIG. 16 is a cross-sectional view showing a subsequent fabrication process for the phase change memory device of FIG. 3.
Figure 17:
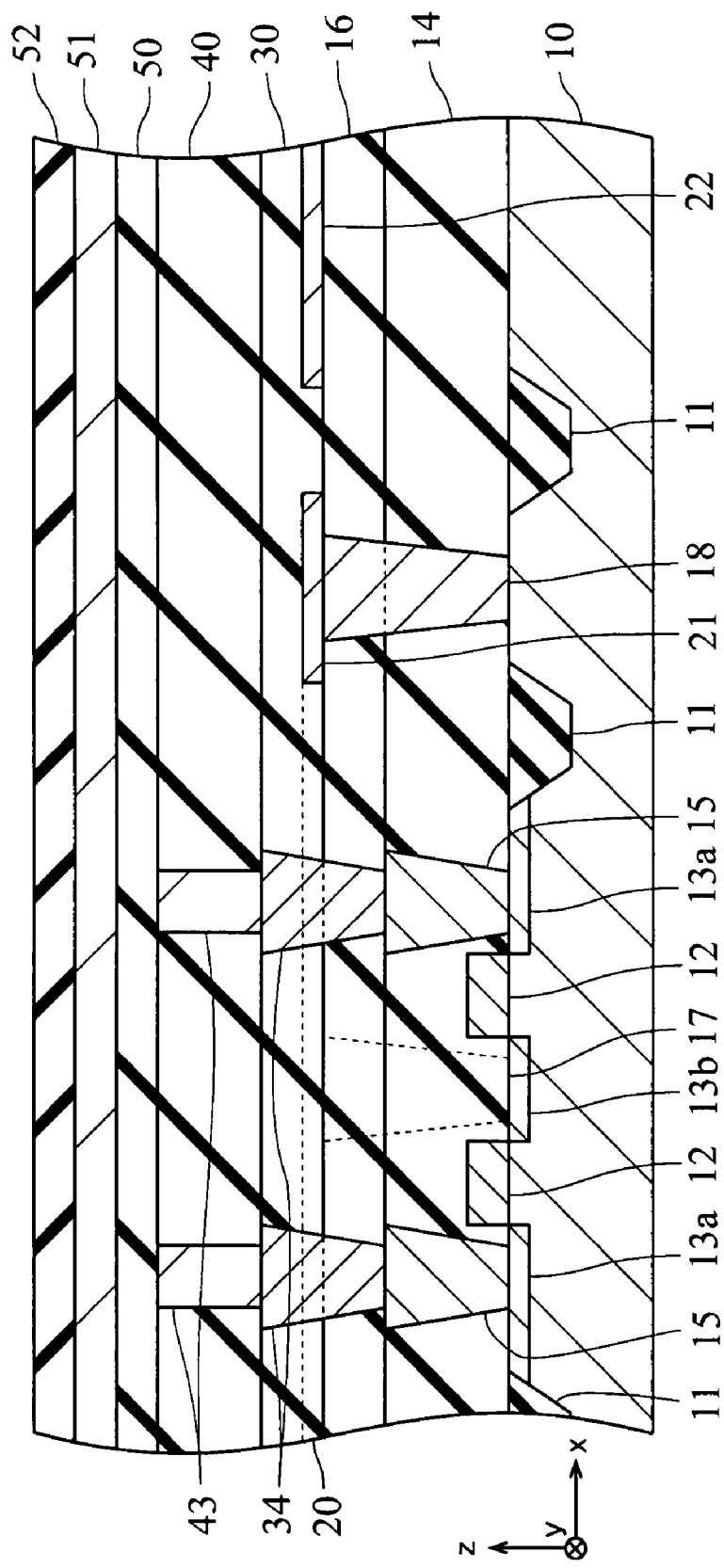
FIG. 17 is a cross-sectional view showing a subsequent fabrication process for the phase change memory device of FIG. 3.

Next, a silicon oxide material of 300 nm is deposited on the insulator layer 30 and the middle contact plugs 34 to form the insulator layer 40. In addition, contact holes 41 are formed to pierce through the insulator layer 40 and to reach the middle contact plugs 34, as shown in FIG. 14. A titanium nitride (TiN) material of 50 nm is deposited on the insulator layer 40 including the contact holes 41 to form a heater material layer 42, as shown in FIG. 15. The heater material layer 42 is exposed to a CMP process up to the surface of the insulator layer 40 to form the heater pillars 43, as shown in FIG. 16.

Figure 18:
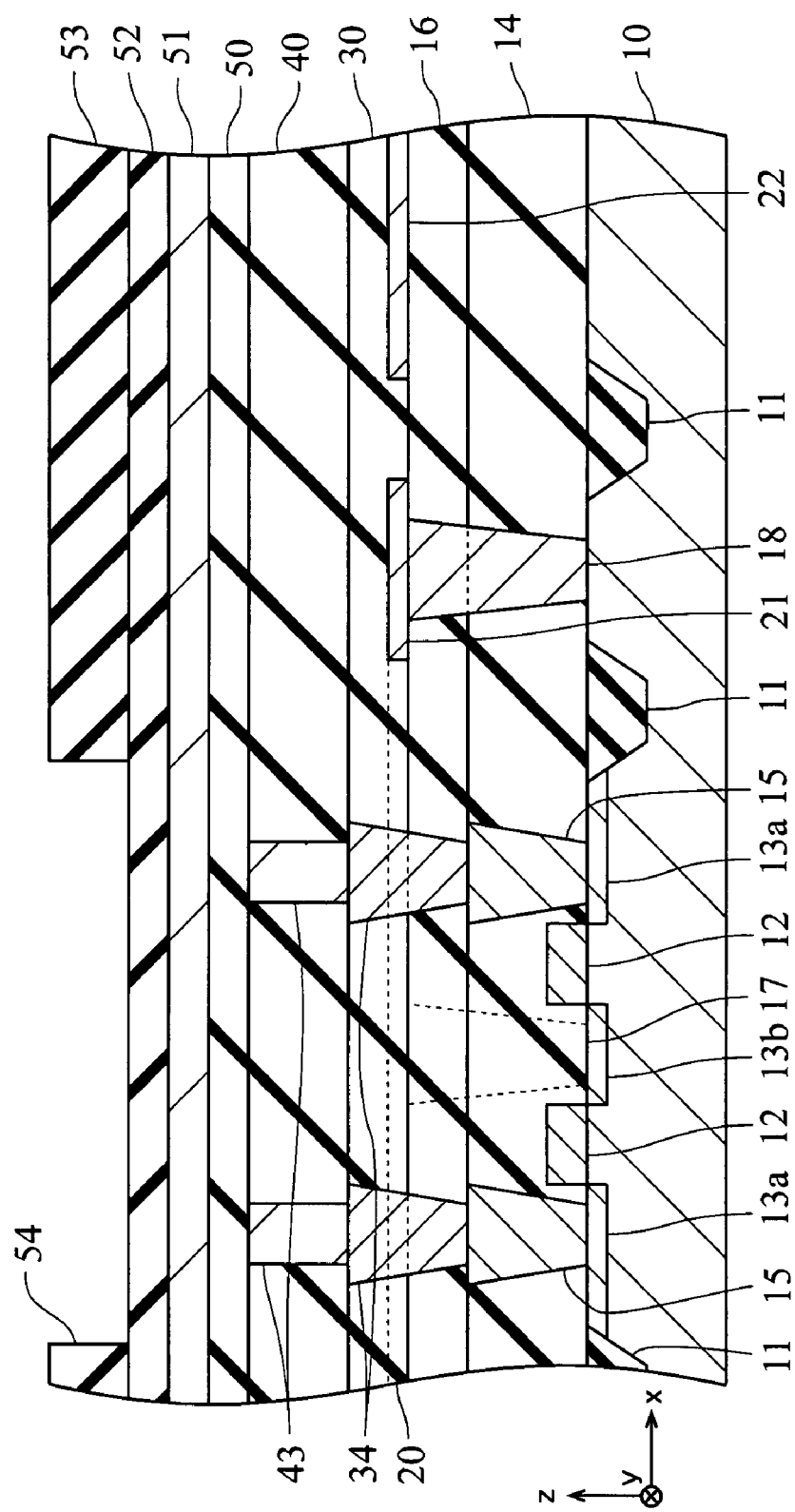
FIG. 18 is a cross-sectional view showing a subsequent fabrication process for the phase change memory device of FIG. 3.
Figure 19:
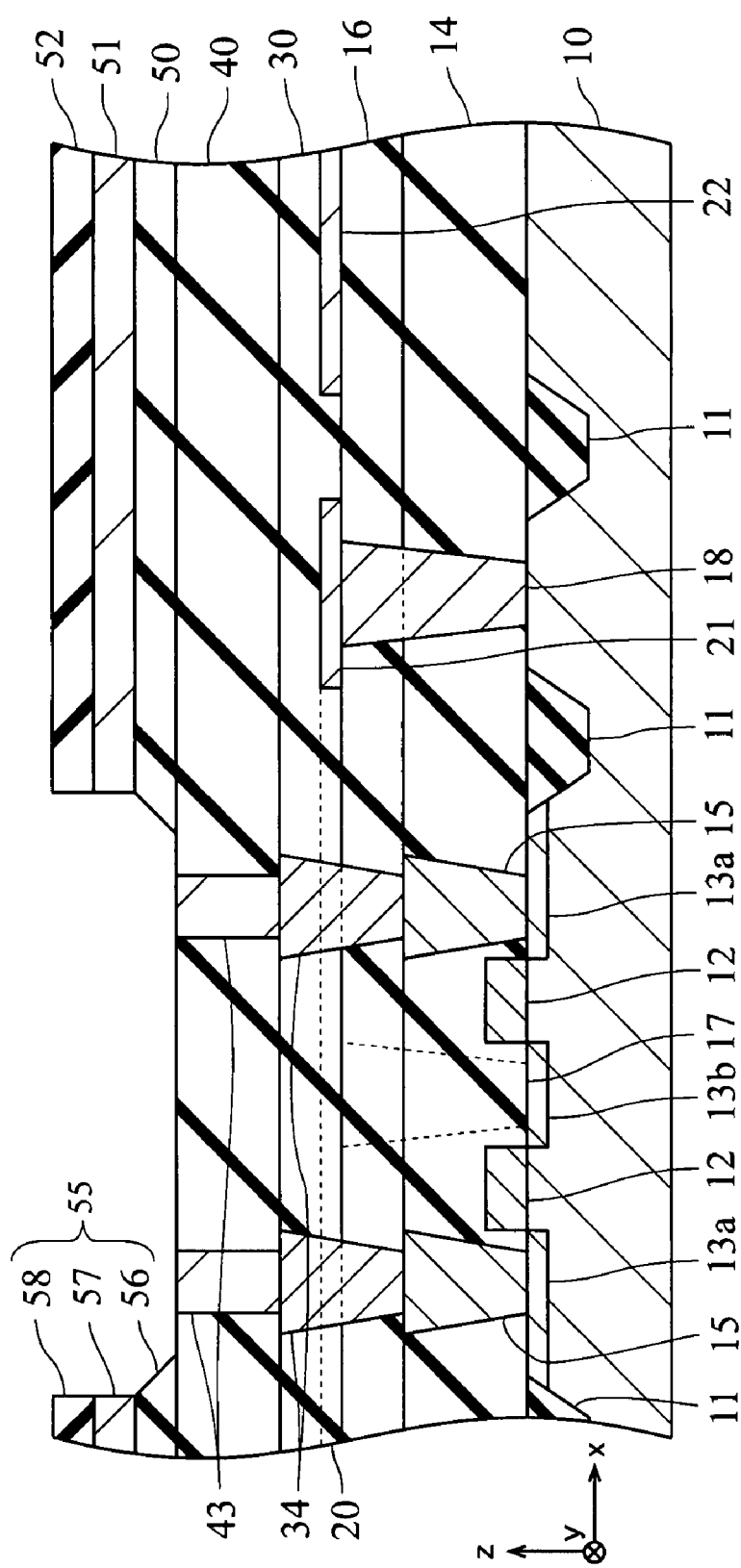
FIG. 19 is a cross-sectional view showing a subsequent fabrication process for the phase change memory device of FIG. 3.

Next, a silicon oxide film of 50 nm is formed as the insulator layer 50 on the insulator layer 40. On the insulator layer 50, a combination of a WN film and a W film is formed as an electrode material layer 51 of 50 nm for the upper electrode 66. On the electrode material layer 51, a silicon nitride layer 52 of 50 nm is formed for the stopper layer 67. Next, a patterned resist layer 53 is formed on the silicon nitride layer 52, wherein the patterned resist layer 53 has holes 54 positioned above the heater pillars 43, as shown in FIG. 18. The silicon nitride layer 52, the electrode material layer 51 and the insulator layer 50 are exposed to an etching process by using the patterned resist 53 as a mask. The etching process forms holes 55. Each of the holes pierces the silicon nitride layer 52, the electrode material layer 51 and the insulator layer 50 so that the tops of the heater pillars 43 can be seen from the above, as shown in FIG. 19. The inner wall 56 of the insulator layer 50, a part of each hole 55, is tapered and has a top edge that defines an area larger than a bottom area of the hole 55.

Figure 20:
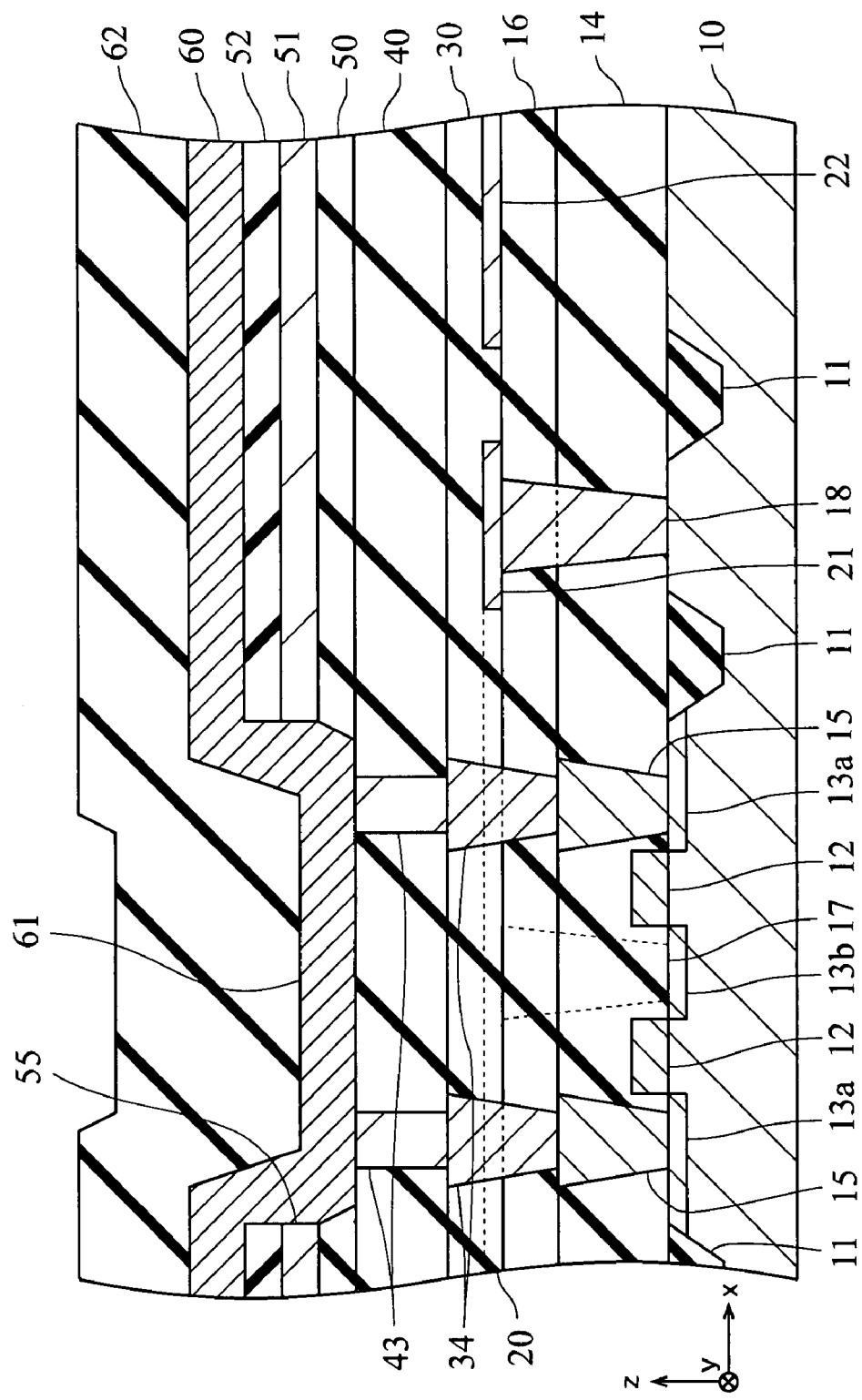
FIG. 20 is a cross-sectional view showing a subsequent fabrication process for the phase change memory device of FIG. 3.

Next, a GST material is deposited on the silicon nitride layer 52 including the holes 55 to form the GST film 60. The GST film 60 preferably has a thickness of 25 nm to 100 nm, more preferably 100 nm. In this embodiment, the thickness of the GST film 60 is 100 nm. In this embodiment, the concave portions 61 are also formed upon the formation of the GST film 60. On the GST film 60, a silicon oxide film of 500 nm is deposited, by using a high-density plasma (HDP) method, to form a heat insulation material layer 62, as shown in FIG. 20.

Figure 21:
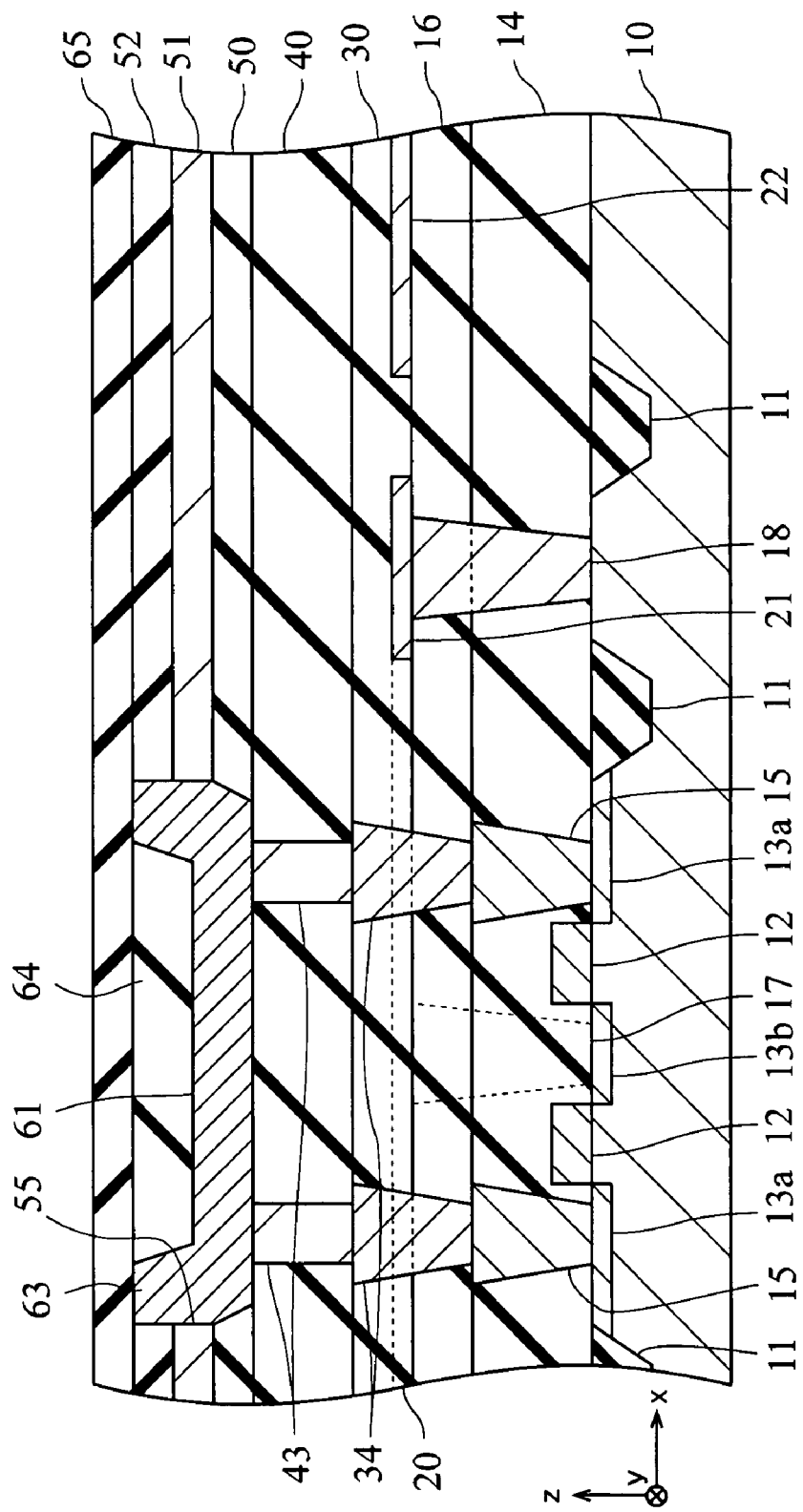
FIG. 21 is a cross-sectional view showing a subsequent fabrication process for the phase change memory device of FIG. 3.

Next, the heat insulation material layer 62 and the GST film 60 are subjected to a CMP process by using the silicon nitride layer 52 as a stopper so that the phase change portions 63 are formed; simultaneously, the heat insulation portions 64 are formed in the respective concave portions 61 of the phase change portions 63, as shown in FIG. 21. Over the heat insulation portions 64 and the phase change portions 63 as well as the silicon nitride layer 52, a silicon nitride film 65 of 50 nm is formed. The formation of the silicon nitride film 65 results in hermetically and completely enclosing or packing the heat insulation portions 64, as shown in FIG. 21.

Figure 22:
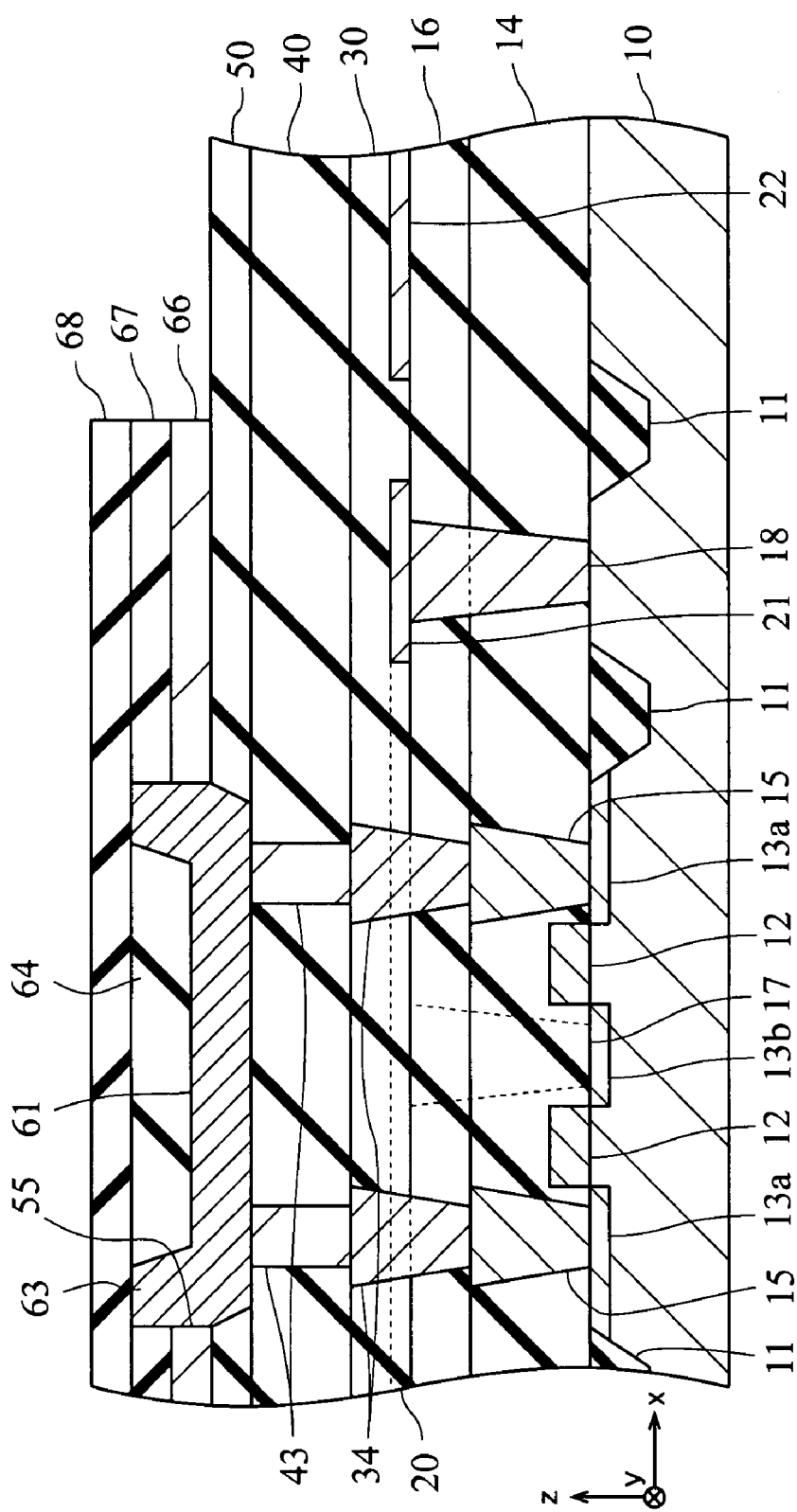
FIG. 22 is a cross-sectional view showing a subsequent fabrication process for the phase change memory device of FIG. 3.

Next, the silicon nitride film 65, the silicon nitride layer 52 and the electrode material layer 57 are exposed to an etching process to form the cover layers 68, the stopper layers 67 and the upper electrodes 62, respectively, as understood from FIGS. 2 and 22.

Next, the insulator layer 70 is formed on the cover layers 68 and the insulator layer 50. Then, the contact plugs 71 and the contact plugs 72 as well as the conductive layer 73 are formed, as shown in FIGS. 2 and 3. Each of the contact plugs 71 connects between the conductive layer 73 and the corresponding upper electrode 66, while each of the contact plugs 72 connects between the conductive layer 73 and the conductive lines 22. Thus, the phase change memory device 1 can be obtained.

The present application is based on Japanese patent applications of JP2006-225768 filed before the Japan Patent Office on Aug. 22, 2006, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A semiconductor memory device comprising:
a heater electrode extending in a first direction;
a phase change portion directly connected to an end of the heater electrode extending in the first direction; and
an upper electrode having an upper surface, a lower surface and a hole, the hole piercing the upper electrode between the upper and the lower surfaces in the first direction, the hole having an inner wall, the inner wall being connected to the phase change portion in a second direction perpendicular to the first direction.

2. The semiconductor memory device according to claim 1, wherein the upper electrode completely surrounds and is connected to the phase change portion in a plane perpendicular to the first direction.

3. The semiconductor memory device according to claim 1, wherein an area of the hole covers a top surface of the heater electrode in plan view.

4. The semiconductor memory device according to claim 1, wherein the phase change portion extends across the lower surface of the upper electrode in the first direction and reaches the upper surface of the upper electrode.

5. The semiconductor memory device according to claim 4, wherein the phase change portion extends further across the upper surface of the upper electrode in the first direction.

6. The semiconductor memory device according to claim 1, wherein the phase change portion has a top surface, a bottom surface and a side surface, the bottom surface being connected to the heater electrode, the side surface connecting between the top and the bottom surface and being connected to the upper electrode.

7. The semiconductor memory device according to claim 6, wherein the upper electrode is connected to the phase change portion only on the side surface thereof.

8. The semiconductor memory device according to claim 6, wherein the top surface of the phase change portion has a closed loop-like shape and has an inner edge, the phase change portion further comprising a concave portion, the concave portion being depressed downwardly from the inner edge of the top surface.

9. The semiconductor memory device according to claim 8, further comprising a heat insulation portion formed of a heat insulation material in the concave portion.

10. The semiconductor memory device according to claim 9, wherein the heat insulation portion comprises two or more heat insulation layers.

11. The semiconductor memory device according to claim 1, wherein the heater electrode comprises two or more heater pillars, at least two of the heater pillars being connected to the phase change portion.

12. A semiconductor memory device comprising:
a heater electrode;
two or more phase change portions connected to the heater electrode in a first direction; and
an upper electrode having an upper surface, a lower surface and a hole, the hole piercing the upper electrode between the upper and the lower surfaces in the first direction, the hole having an inner wall, the inner wall being connected to the phase change portion in a second direction perpendicular to the first direction,
wherein the upper electrode extends in the second direction and is formed with two or more of the piercing holes, the phase change portions being formed in and being connected to the piercing holes, respectively.

13. A semiconductor memory device comprising:
a heater electrode extending in a first direction;
a phase change portion directly connected to an end of the heater electrode extending in the first direction; and
an upper electrode having an upper surface, a lower surface and a hole, the hole penetrating the upper electrode between the upper and the lower surfaces in the first direction, the upper electrode including an outer wall that defines a peripheral edge thereof and an inner wall that is defined by the hole,
wherein the inner wall is disconnected from the outer wall, and the inner wall is connected directly to the phase change portion in a second direction perpendicular to the first direction.

14. The semiconductor memory device of claim 13, wherein the phase change portion is free from contact with the outer wall of the upper electrode.

* * * * *